(12) United States Patent
Muren

(10) Patent No.: US 8,359,734 B2
(45) Date of Patent: Jan. 29, 2013

(54) ALIGNMENT JIG FOR ELECTRONIC COMPONENT

(75) Inventor: Petter Muren, Nesbru (NO)

(73) Assignee: Cisco Technology, Inc., San Jose, CA (US)

( * ) Notice: Subject to any disclaimer, the term of this patent is extended or adjusted under 35 U.S.C. 154(b) by 1189 days.

(21) Appl. No.: 12/200,153

(22) Filed: Aug. 28, 2008

(65) Prior Publication Data

US 2009/0056111 A1 Mar. 5, 2009

Related U.S. Application Data

(60) Provisional application No. 60/970,123, filed on Sep. 5, 2007.

(51) Int. Cl.
*B23P 19/00* (2006.01)

(52) U.S. Cl. ............................................. 29/740; 29/760

(58) Field of Classification Search ............ 29/729, 29/739, 740, 758–761; 228/44.7, 49.1; 361/719
See application file for complete search history.

(56) References Cited

U.S. PATENT DOCUMENTS

| | | | | |
|---|---|---|---|---|
| 5,060,846 A | * | 10/1991 | Schaeffer et al. | 228/44.7 |
| 5,369,879 A | * | 12/1994 | Goeschel et al. | 29/741 |
| 6,049,656 A | | 4/2000 | Kim et al. | |

FOREIGN PATENT DOCUMENTS

| | | |
|---|---|---|
| JP | 3-38089 | 2/1991 |
| JP | 4-233296 | 8/1992 |
| JP | 6-77620 | 3/1994 |
| JP | 6-334325 | 12/1994 |
| JP | 7-122315 | 5/1995 |
| JP | 9-260834 | 10/1997 |
| JP | 10-84183 | 3/1998 |
| JP | 2002-261433 | 9/2002 |

* cited by examiner

*Primary Examiner* — Donghai D. Nguyen
(74) *Attorney, Agent, or Firm* — Oblon, Spivak, McClelland, Maier & Neustadt, L.L.P.

(57) ABSTRACT

A jig securing alignment and positional accuracy in all directions (x, y, z) for an electrical component to be soldered to a PCB is provided. The jig positions the IC in the x and y directions, and keeps the IC from rotating. The jig also holds the IC down during the soldering process to make sure that the IC remains parallel to the PCB before, during and after soldering. The jig attaches to mounting holes on the PCB and its placement can be automated or performed manually.

16 Claims, 3 Drawing Sheets

Background

Background

Background

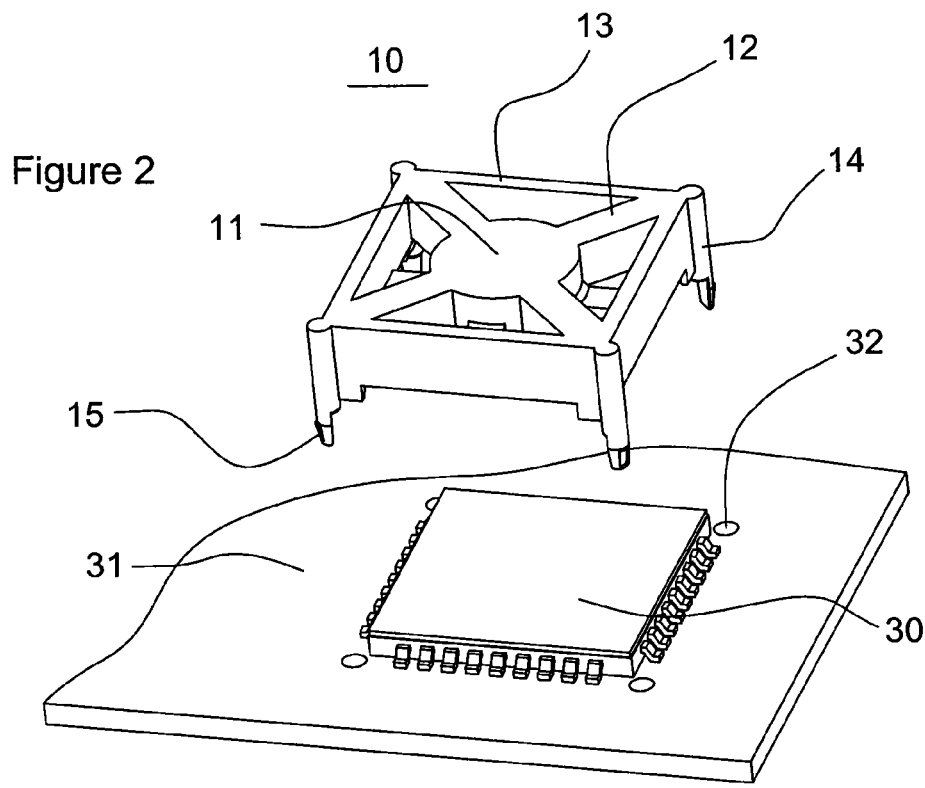
Figure 2
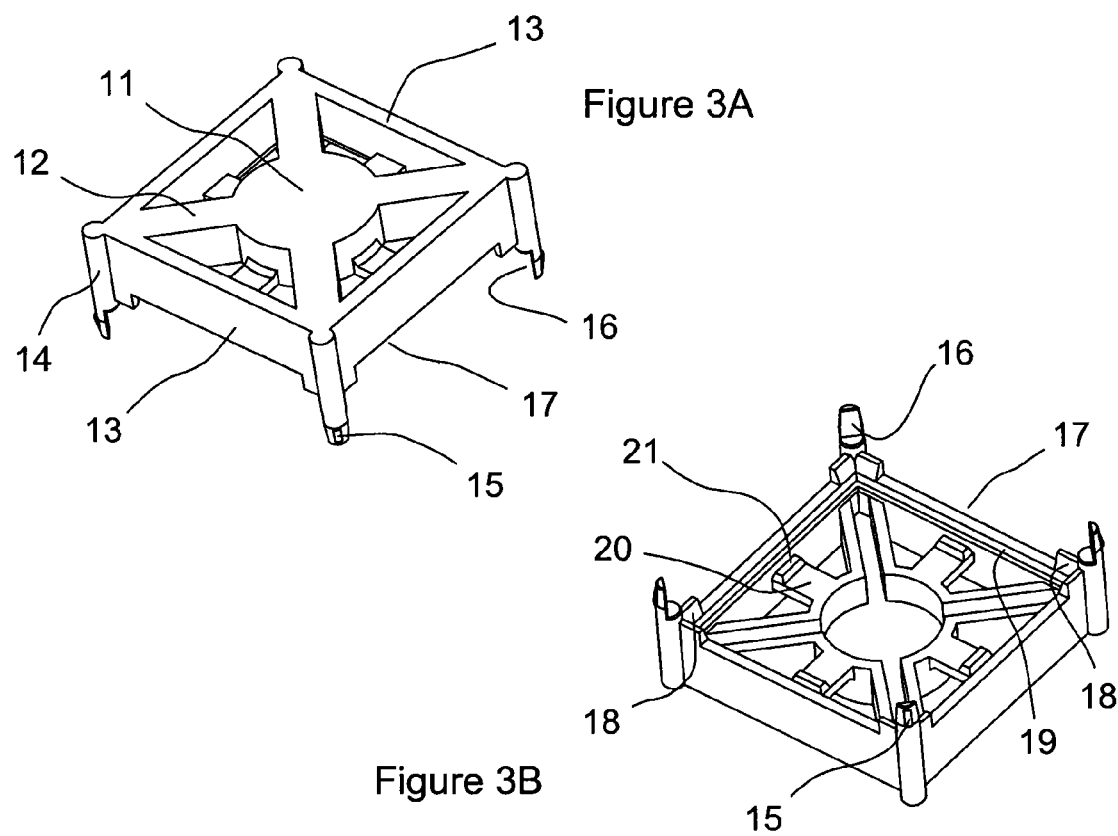
Figure 3A
Figure 3B

ALIGNMENT JIG FOR ELECTRONIC COMPONENT

CROSS REFERENCE TO RELATED APPLICATION

This application claims the benefit of the earlier filing date of U.S. Provisional Application No. 60/970,123, filed Sep. 5, 2007, entitled "Alignment Jig for Electronic Component," the entirety of which is incorporated herein by reference.

BACKGROUND

The present disclosure relates to the assembly of printed circuit boards, and, more particularly, a device and methodology for positioning and retaining an electronic component on a printed circuit board during assembly.

Printed circuit boards (PCB) are known in the art for positioning and connecting electronic components, such as integrated circuits (IC), thereon. Typically, the placement and soldering of the ICs onto the PCB is an automated process in which armatures select components from a storage location and place the selected component in a pre-programmed position on the PCB. Printed circuit boards for surface mounted components have flat, usually tin, silver or gold plated copper pads without holes. In such configurations, components are attached to the printed circuit boards by soldering them onto these pads.

Prior to soldering, solder paste, a sticky mixture of flux and tiny solder particles, is applied to all the solder pads. After initial placement of all of the components, the PCB moves through a soldering area where the components are soldered to the PCB. In the soldering area the temperature is high enough to melt the solder particles in the solder paste, bonding the component pins to the pads on the circuit board. The surface tension of the molten solder helps keep the components in place, and if the solder pad geometries are correctly designed, surface tension automatically aligns the components on their pads.

Some components (an optical sensors, for example) require precise positioning with respect to the PCB or to another object (optical lens, for example). For example, an image sensor and an associated optical lens are to be mounted directly onto a PCB. The PCB has mounting holes for the optical lens. If the sensor is not aligned correctly with the mounting holes in the PCB (and hence the optical lens) the picture quality from the sensor will be less than optimal, and time-consuming adjustments might be necessary. Due to the very small sizes and pin spacing of surface mounted devices (SMD) manual handling and component-level repair is extremely difficult, and often uneconomical.

During placement of IC components on the printed circuit board and subsequent soldering process, an IC component may migrate from an initial placement position. Even if the IC is glued to the PCB when initially placed, misalignment in several directions may occur. As illustrated in FIGS. 1A and 1B, an IC may be misaligned in both x and y directions, and may also be misaligned in rotation (the dotted line 34 in FIGS. 1A and 1B illustrates the perfect position for the component pins). Additionally, solder may form under the pins or soldering points of the IC causing a lifting in the z direction (upward from the PCB), as illustrated in FIG. 1C, and tilting the sensor with respect to the PCB.

For most IC's, for example microprocessors and memory chips, such misalignment does not degrade the performance of the IC as long as the component pins have sufficient contact with the correct solder pads. However, such misalignment may result in severe problems in optical sensor systems. For example, in systems where an optical sensor and its optical lens are connected to the same PCB, the slightest misalignment of the image sensor may cause severe image deterioration. This occurs because once the optical sensor is tilted with respect to the PCB, at least part of the optical sensor may fall outside a focus plane of the lens.

One method of accounting for such deficiencies is to align or attach the optics directly to the sensor instead of the PCB, however, this is both expensive and complicated. Furthermore, there are several examples of soldering jigs for connectors, switches and other electric devices, but few of these jigs are intended for electronic components mounted on a PCB.

One device intended for preventing components having pins that go through the PCB from lifting during the soldering process, is described in Japanese patent application JP2002261433. This device does not guide or adjust the position of the component and is used for components with pins that go through the PCB.

Japanese publication, JP3038089, describes a jig in the form of a frame that is placed around an IC. This solution is intended for surface mounted components and holds the IC in place in the horizontal plane while soldering. However, this soldering jig does not secure the IC in the vertical direction, and is not constructed to guide the IC to a correct position. On the contrary, the cavity of the jig is larger than the IC, requiring manual mounting of the jig on the PCB.

The soldering jig of Japanese publication JP10084183 is also placed over a surface mounted IC. This jig, however, is intended to prevent solder bridges by masking the space between each of the pines of an IC during the soldering process. Japanese publication JP6334325 describes a guide pin on the IC and a corresponding tapered part on the PCB to position the IC on the printed circuit board.

SUMMARY

The present disclosure provides a jig and associated methodology for manufacturing an electronic device that solves the aforementioned deficiencies in the art.

An exemplary jig for aligning and supporting an electronic component on a printed circuit board (PCB) includes a frame defining an opening of a size and shape corresponding to at least one part of the electronic component. The jig also includes a plurality of guide members extending from the frame to guide the electronic component into the opening, and mounting pins to engage the printed circuit board, interlocking the jig to the printed circuit board. At least one holding member for supporting a top surface of the electronic component is also included in the jig.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings. However, the accompanying drawings and their exemplary depictions do not in any way limit the scope of the disclosure embraced by this specification. The scope of the disclosure embraced by the specification and drawings is defined by the words of the accompanying claims.

FIG. 2 is a schematic of a jig according to an exemplary embodiment of the present disclosure and parts of a printed circuit board;

FIG. 3A is a top view schematic of a jig according to an exemplary embodiment of the present disclosure;

FIG. 3B is a bottom view schematic of a jig according to an exemplary embodiment of the present disclosure;

DETAILED DESCRIPTION

Figure 1A:
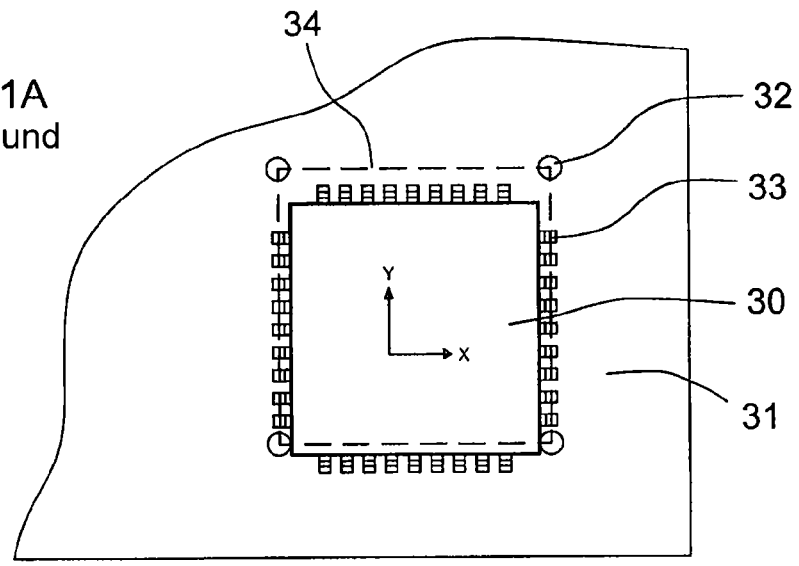
FIG. 1A is a first schematic of an electronic component misaligned respective to an optimal position.
Figure 1B:
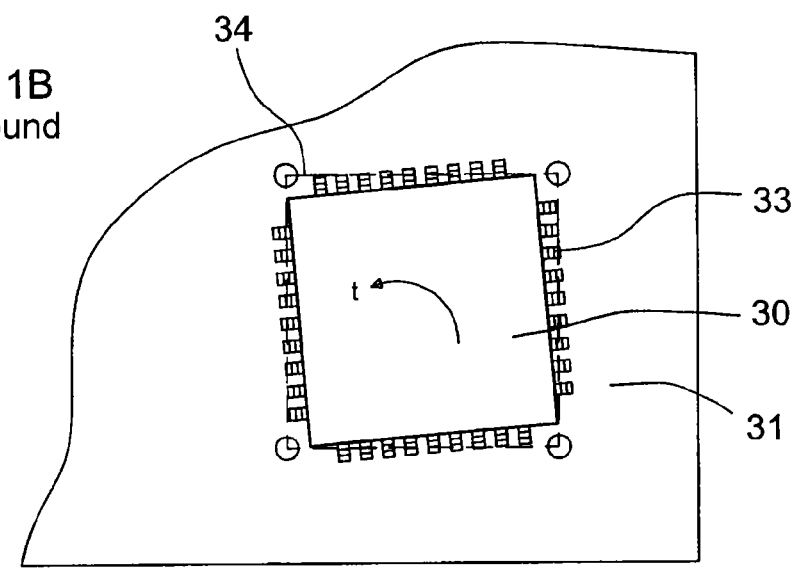
FIG. 1B is a second schematic of an electronic component misaligned respective to an optimal position.
Figure 1C:
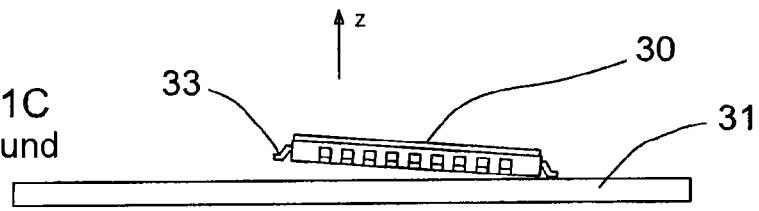
FIG. 1C is a third schematic of an electronic component misaligned respective to an optimal position.

The present disclosure describes a preferred embodiment by referring to the accompanying drawings. However, people skilled in the art will realize other applications and modifications within the scope of the disclosure.

As used herein, the term "component pin" refers to the metallic conductor of an electrical or electronic component that is joined to the printed circuit pattern, for example, the component leads, pins, terminals, lugs, etc. The term "pad" as used herein refers to the metallic pattern on the printed circuit to which the pin is joined.

A method and a device (a soldering jig) for correctly positioning, and retaining, during soldering, an IC or similar electronic components on a printed circuit board (PCB) is described herein.

As mentioned above, when electrical components are soldered to a PCB, components may be misaligned with respect to an optimal placement position. The misalignment may not be problematic for the electrical connectivity between component pins and soldering pads, but for certain components (such as image sensors) the misalignment may cause serious problems.

Referring now to FIG. 2, in order to secure good alignment and positional accuracy in all directions (x, y, z) for an electrical component 30 to be soldered to a PCB 31, a jig 10 according to an exemplary embodiment is utilized. The exemplary jig 10 positions the IC 30 in the x and y directions (sideways, back and forth), in rotation t, and to press the IC 30 against the PCB 31 during the soldering process, ensuring that the IC 30 remains parallel to the PCB 31 before, during and after soldering.

FIGS. 3A and 3B show a top view and bottom view, respectively, of an alignment jig according to one exemplary embodiment of the present disclosure. The jig 10 comprises a frame 13, a central body 11, a set of mounting pins 14 and one or a set of supporting structures 12 connecting the central body 11 to the frame 13.

The frame 13 has an opening, confined by the vertical inner surfaces 19 of the frame 13, having a size and shape corresponding to at least a part of the electronic component 30 to be joined to the PCB 31. In other words, the inner dimension of the frame 13 is substantially complementary to the outer dimensions of at least parts of the electronic component 30 to be aligned by the jig 10, and has a substantially complementary shape. Substantially here is a relative term, the scope of which will be known to one of skill in the art as corresponding to deviations in size and shape encountered in mass-produced components to be mounted that are nominally identical. However, the opening in the frame 13 (or the inner dimension of the frame) preferably provides a snug fit around the electronic component 13 (or parts thereof).

A set of guiding members are associated with the frame 13 to guide an electronic component 30, or at least a part of the electronic component 30, into the opening of frame 13. According to one exemplary embodiment of the present disclosure, a set of guiding tongues 18 protrude from the bottom of the frame 13. The guiding tongues 18 are tapered, creating a slope from the vertical inner surface 19. This embodiment prevents protruding parts of the electronic component 30 (e.g. the component pins) from obstructing or interfering with the frame 13 during alignment. In alternate embodiments the guiding tongues 18 may be anchored to other locations of the frame 13, central body 11, or supporting structures 12.

Figure 6:
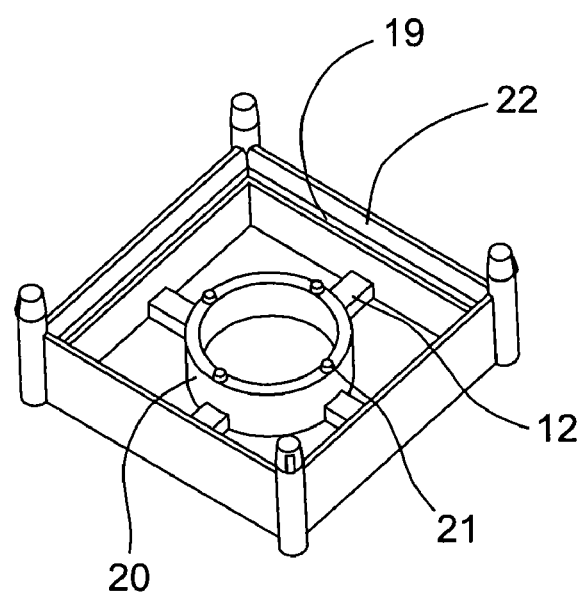
FIG. 6 is a schematic of an alternate embodiment of a jig according to the present disclosure.

In another exemplary embodiment of the disclosure, the frame 13 itself is chamfered, creating a tapered lower portion 22 (referred to as guiding member) of the frame 13 for guiding the electronic component 30, or parts of the electronic component 30, into the opening 19 of the frame 13, as shown in FIG. 6.

Also shown in FIG. 6, the jig 10 comprises a set of mounting pins 14 extending from of the frame 13. The mounting pins 14 are designed to engage with a corresponding set of holes 32 in the PCB 31, and interlock to the PCB 31.

According to the exemplary embodiment of the present disclosure shown in FIGS. 3A and 3B, the mounting pins 14 comprise a flexible arm 16 with barbs 15. In this arrangement, the mounting pins 14 are urged through the corresponding set of holes 32 and the barbs 15 engage with the PCB 31 locking the jig 10 to the PCB 31. Removal of the jig 10 requires the application of pressure to the mounting pins 14, manually or with the aid of tools, to prevent the barbs 15 from engaging with the PCB 31. Any type of semi-permanent or quick-release type of locking pin may be used with devices and methodologies described herein. Further, the mounting pins 14 or the holes 32 may be slightly tapered to ease the entry (or guide) of the mounting pins 14 into the holes 32.

Further, the jig 10 comprises one or more holding members for gently pressing the electronic component 30 against the PCB 31, thereby holding the electronic component 30 parallel to the PCB 31, and preventing the electronic component 30, or parts of the electronic component 31, from lifting during soldering. To ensure a correct fastening of the jig 10 to the PCB 31 and simultaneously provide a firm pressure on the electronic component 30, the holding members are at least partly elastically pliable under the return force from the electronic component 30. The holding members would typically interact with the top surface of the component, or parts of the top surface. Exemplary holding members are a set of flexible holding arms 20 extending substantially horizontally from the lowest part of the central member 11, as shown in FIG. 3B. The holding arms 20 comprise contact members 21 protruding downward from the distal end of the holding arms 20. The central member 11 and its holding arms 20 are designed such that the holding arms 20 and/or the contact member 21 are at least partly elastically pliable under the return force of engagement with an electronic component 31. In other words, when the jig 10 is pressed against an electronic component 30, the flexible holding arms 20 and/or contact members 21 create a spring-like effect on the electronic component 30, pressing the electronic component 30 against the PCB 31.

Figure 4:
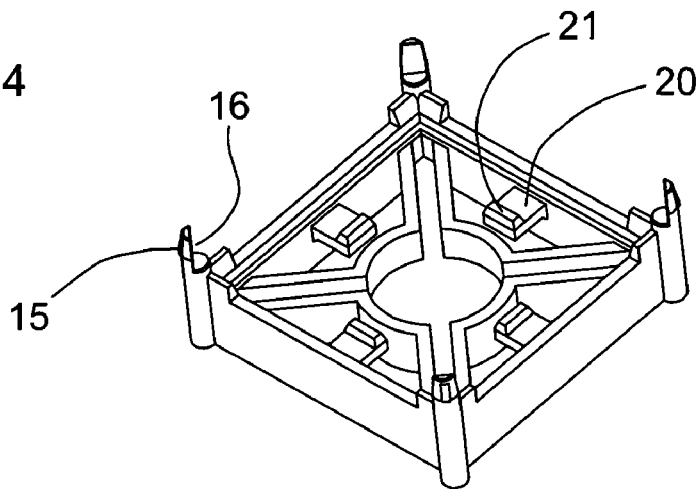
FIG. 4 is a schematic of an alternate embodiment of a jig according to the present disclosure.

In an alternate embodiment, the holding members are a set of flexible holding arms 20, extending substantially horizontally from the frame 13, as shown in FIG. 4. The holding arms 20 comprise contact members 21 protruding downward from the distal end of the holding arms 20. The holding arms 20 and contact members 21 have the characteristics described above regarding flexibility.

Figure 5:
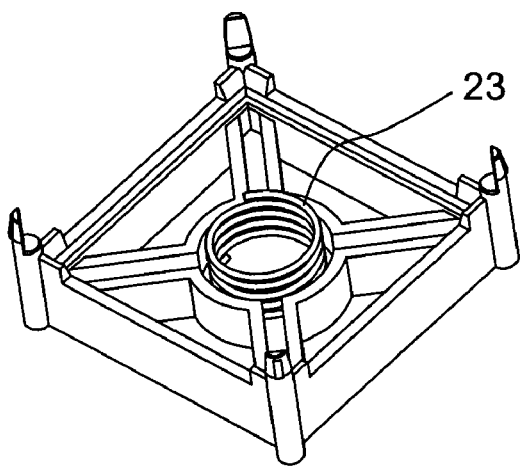
FIG. 5 is a schematic of an alternate embodiment of a jig according to the present disclosure.

According to another exemplary embodiment of the present disclosure, the holding member is a spring 23, or a spring-like object, associated with the central member 11, as shown in FIG. 5. Alternatively, the central body 11 may be formed of an elastomeric material formed to abut an electronic component 30 and compress in the manner of the spring 23. For example, the central body 11 may be formed of a compressible foam or rubber material having a shape memory for returning to a shape after compression.

The exemplary central body 11 is stiffly anchored to the frame 13 by one or a set of supporting members 12. Further, the central body 11 has a substantially flat top surface. Most pick-and-place machines for electronic components have placement heads comprising a nozzle for holding a component in place by suction. The substantially flat top surface of central member 11 provides compatibility with these traditional pick-an-place machines.

In yet another alternative embodiment of the present disclosure, the central member 11 acts as holding member 20 and a set of contact members 21 protrude downwards from the bottom of the central member 11, as shown in FIG. 6. According to this embodiment, supporting members 12 are flexible to provide the elastic pliability to the holding member. Since the central member 11 is not stiffly anchored to the frame 13, this embodiment may require manual installation or a dedicated pick-and-place machine.

Referring back to FIG. 2, during the assembly of a PCB 31, a robot or mechanical armature (pick-and-place machine) picks an IC 30 or other electrical component 30 (e.g. an optical sensor) from a feeder and places it onto the PCB 31. The robot is programmed to place the electronic component 30 in a correct position such that the component pins 33 align with the soldering pads (not shown) on the PCB 31. Typically these soldering pads are covered with a solder paste prior to the placement of the electronic component 30. When the PCB 31 is heated the solder particles in the paste melt and bond the component pins 33 to the pads on the PCB 31.

In FIG. 2, the PCB 31 may have guiding/mounting holes 32 in close proximity to the electrical component 30 (in other words, in close proximity to the soldering pads for the electrical component 31), which will later be used to mount an object (not shown) in a position relative to the IC 30, for example an optic lens. Since these holes 32 determine the final position of the object to be mounted, and since the relative position between the electrical component 30 and the object may be crucial, the same mounting holes 32 are used as guiding/mounting holes for the jig 10. According to another embodiment of the present invention, the PCB may have dedicated guiding/mounting holes for the jig 10.

In operation, as previously noted, when an IC 30 is placed on the PCB 31 there may be misalignment with respect to the mounting holes 32. For example, the IC 30 may be misplaced slightly sideways (x-direction) or slightly back or forth (y-direction). It may also be slightly rotated, or placed at a wrong angle in the horizontal plane.

Therefore, after the IC 30 is placed on the PCB 31, the robot or armature selects the jig 10 from a feeder and places the jig 10 over the IC 30. When the robot presses the jig towards the PCB 31, the mounting pins 14 (or parts of the mounting pins 14, such as the flexible arms 16) on the jig 10 enter the mounting holes 32 in the PCB 31. The holes 32 act as guiding holes for the jig 10. The tips of the mounting pins 14 may have a conical shape to easily being able to enter the holes 32 even if the accuracy of the robot is inexact. After the tip of the mounting pins 14 enter the mounting holes 32, the jig 10 is further pressed towards the PCB 31. If the IC 30 is not correctly positioned on the PCB 31, the edges of at least parts of the IC 30 will come in contact with the component guiding members 18 of the frame 13. When the jig 10 is pressed further towards the PCB 31 the guiding members 18 move the IC 30 into the correct position. Just before the jig is in place, the edges of at least parts of the IC pass the guiding members 18 and enter the part of the frame 13 having substantially vertical edges 19 (also referred to as the opening in the frame 13). The tips of the corner pins 14 have small barbs 15 (or hooks) on a side, and parts of the corner pins 14 may be removed to make the pins more flexible, making room for the barbs 15 to pass down through the holes 32. When the jig 10 is in a final position, completely against the PCB 31, the barbs 15 exit the holes 32 on the other side of the PCB 31 and lock the jig 10 to the PCB 31.

As the jig 10 approaches the final position, the elastically pliable holding member, and contact members 21, engage the top surface of the IC 30 and flex, creating a constant holddown force on the IC 30. The barbs 15 on one side of the PCB 31 and the holding member on the other side of the PCB 31, lock the jig 10 and the IC 30 to the PCB 31. The jig 10, firmly held on the PCB 31 and secured by the barbs 15 (or hooks), positions the IC 30 correctly in the x, y and rotational directions. Further, the jig 10 prevents the IC 30 from tilting relative to the PCB 31.

With the Jig 10 and the IC 30 firmly attached, the PCB 31 can move through the soldering zone where the solder particles in the solder paste are heated to their melting point. The pins 33 of the IC 30 are bonded to the PCB's solder pads as the PCB 31 cools. During the soldering process the IC 30 is held in position by the jig 10 and pressed against the solder pads of the PCB 31, preventing lifting and/or tilting.

During testing and further handling of the PCB 31 the jig 10 protects the IC 30. To mount an object (e.g. optic lens) relative to the IC 30, the jig 10 may easily be removed by compressing the barbs 15 (or at least parts of the pins) at the underside of the PCB 31 until the barbs 15 release from the PCB 31. The object (e.g. optical lens) may use the same mounting holes 32 as the jig 10; hence the object (e.g. optical lens) is automatically aligned with respect to the IC 30.

According to one exemplary embodiment of the invention, the jig 10 is permanently attached to the PCB 31. An object may then be mounted on the jig 10 instead of the PCB 31. The jig 10 also has other features that ensure a safe function. For example, the central body 11 of the jig 10 has a substantially flat and smooth top surface, enabling a robot or armature (or pick-and-place machine) to use a vacuum pickup device to hold the jig 10 during assembly. The robot or armature may also use the central body 11 to press the jig 10 onto the PCB 31. Further, to press the mounting pins 14 firmly and evenly, the central body 11 is connected to the frame 13 of the jig 10 by rigid arms 12 extending from the center body 11 outward to the frame 13.

To be able to withstand high soldering temperatures jig 10 should be made of a heat resistant material, such as a heat resistant plastic, for example polyamides. The jig 10 may be injection molded in a suitable high temperature polymer material, reaction injection molded, or created by any suitable production technique. The jig 10 may be made of metal. However, the shape of the jig 10 should not significantly change during high temperature soldering, and the support members 12 pressing the IC 30 against the PCB 31 should not lose stiffness. The jig 10 may have any number of mounting pins 14.

The jig 10 according to the present disclosure correctly positions an IC 30 relative to soldering pads on a PCB 31, and presses the IC 30 against the PCB 31 during soldering procedures, thereby preventing the IC 30 from moving both in the horizontal and vertical plane. Further, the jig 10 positions an IC 30 with respect to a set of mounting holes 32, used, for example, to mount optics or other objects that are to be mounted to the PCB 31 at a later stage of assembly, and that need to be precisely positioned relative to the IC 30.

The jig may easily be handled (picked and placed) by a robot or armature (pick-and-place machine), and may easily be removed (snapped off) automatically or manually. As can be appreciated, the jig 10 protects the IC 30 during testing and further handling of the PCB 31.

Further, the jig 10 prevents expensive, time consuming manual correction of faulty soldered IC's, reducing production cost and increasing product quality.

The foregoing discussion discloses merely exemplary embodiments of the present disclosure. As will be understood by those skilled in the art, the present disclosure may be embodied in other specific forms without departing from the spirit or essential characteristics thereof. Accordingly, the disclosure of the present advancement is intended to be illustrative, but not limiting of the scope of the advancement, as well as other claims. The disclosure, including any readily discernible variants of the teachings herein, define, in part, the scope of the foregoing terminology.

The invention claimed is:

1. A jig for aligning and supporting an electronic component on a printed circuit board (PCB) during assembly, comprising:
   a frame defining an opening of a size and shape corresponding to at least one part of the electronic component;
   guide members, extending from each corner of the frame, configured to guide the electronic component into the opening defined by the frame, the guide members including mounting pins that are configured to engage with a corresponding set of holes in the printed circuit board to interlock, the jig to the printed circuit board; and
   at least one holding member for supporting a top surface of the electronic component.

2. A jig according to claim 1, wherein the at least one holding member is at least partly elastically pliable.

3. A jig according to claim 1, further comprising:
   a central body rigidly formed within the frame, the central body having a substantially flat top surface.

4. A jig according to claim 1, wherein the holding member is a flexible holding arm extending substantially horizontally from the frame and having, in an area of a distal end of the holding member, a contact member for supporting with the top surface of the electronic component.

5. A jig according to claim 3, wherein the at least one holding member is a flexible holding arm extending substantially horizontally from the central body and having, in an area of a distal end of the holding member, a contact member for interacting with the top surface of the electronic component.

6. A jig according to claim 3, wherein the holding member is a spring.

7. A jig according to claim 1, wherein the guide members are tapered at the bottom of the frame.

8. A jig according to claim 1, wherein the guide members are a tapered part of the frame.

9. A jig according to claim 1, wherein the mounting pins are flexible, and each mounting pin includes a barb.

10. The jig according to claim 1, wherein at least two guiding members are disposed at each corner of the frame.

11. The jig according to claim 10, wherein the frame is formed by walls, and one guiding member is disposed on each wall forming each corner of the frame.

12. The jig according to claim 1, wherein the jig is formed of polyamides to resist soldering temperatures.

13. A jig for aligning and supporting an electronic component on a printed circuit board (PCB) during assembly, comprising:
   a frame defining an opening of a size and shape corresponding to at least one part of the electronic component;
   guide members, extending from each corner of the frame, configured to guide the electronic component into the opening defined by the frame, the guide members including mounting pins that are configured to engage with a corresponding set of holes in the printed circuit board to interlock the jig to the printed circuit board; and
   a central body formed of a compressible material and arranged at a central location of frame to press against the at least one part of the electronic part.

14. The jig according to claim 13, wherein the central body is rigidly attached to each internal corner of the frame by a corresponding supporting arm.

15. The jig according to claim 13, wherein the central body is formed from a compressible foam.

16. The jig according to claim 13, wherein the central body is formed of a rubber material.

* * * * *